United States Patent
Lausberg et al.

(10) Patent No.: US 6,210,179 B1
(45) Date of Patent: Apr. 3, 2001

(54) FIELD-BUS CONNECTING DEVICE

(75) Inventors: Gerd Lausberg, Dortmund; Yasar Cevik, Hagen, both of (DE)

(73) Assignee: K. A. Schmersal GmbH & Co., Wuppertal (DE)

( * ) Notice: Subject to any disclaimer, the term of this patent is extended or adjusted under 35 U.S.C. 154(b) by 0 days.

(21) Appl. No.: 09/452,225

(22) Filed: Dec. 1, 1999

(30) Foreign Application Priority Data

Dec. 3, 1998 (DE) .............................................. 198 55 869

(51) Int. Cl.$^7$ ....................................................... H05K 1/00
(52) U.S. Cl. .............................................. 439/76.1; 439/67
(58) Field of Search .................................... 439/76.1, 716, 439/712, 715, 713, 76.2, 717, 718, 61, 631, 67; 361/752, 785

(56) References Cited

U.S. PATENT DOCUMENTS

| | | | |
|---|---|---|---|
| 4,770,639 | * 9/1988 | Lau | 439/61 |
| 5,043,847 | * 8/1991 | Deinherdt et al. | 361/395 |
| 5,218,519 | * 6/1993 | Welch et al. | 361/415 |
| 5,319,524 | * 6/1994 | Welch et al. | 361/754 |
| 5,546,282 | * 8/1996 | Hill et al. | 361/796 |

FOREIGN PATENT DOCUMENTS

| | | |
|---|---|---|
| 3933 099 A1 | 10/1989 | (DE) . |
| 44 12 270 C2 | 10/1995 | (DE) . |
| 4412270C2 | * 1/1996 | (DE) . |
| 3933099A1 | * 4/1996 | (DE) . |
| 196 15 093 A1 | 4/1996 | (DE) . |
| 296 07 525 U1 | 4/1996 | (DE) . |
| 4437316A1 | * 4/1996 | (DE) . |
| 197 16 137 C1 | 4/1997 | (DE) . |

* cited by examiner

Primary Examiner—Gary Paumen
Assistant Examiner—Ross Gushi
(74) Attorney, Agent, or Firm—Alix, Yale & Ristas, LLP

(57) ABSTRACT

The invention relates to a field-bus connecting device having a motherboard which is arranged in an essentially square housing at the base and a plurality of modules which hold at least one connection element by means of a module mounting board, for connection to the motherboard, the housing having at the connection element end a plurality of receptacles for, in each case, one module and each module being detachably coupled to the motherboard by means of a connector arrangement which is plugged on to the motherboard, and the modules each comprise a module board which is connected to the respective module mounting board, is configured to correspond to the at least one connection element and couples the module to the motherboard by means of the connector arrangement, and the receptacles each have a receptacle space, open at the connection element end, for, in each case, one module with base-end openings for the connector arrangement.

17 Claims, 4 Drawing Sheets

FIELD-BUS CONNECTING DEVICE

FIELD OF THE INVENTION

The invention relates to a field-bus connecting device usable in connection with field buses as a serial bus system to connect devices for instance for sensor or acting with control means or the like.

BACKGROUND OF THE INVENTION

Known field-bus connecting devices hold, in an essentially square housing, a motherboard which is supported on the base. On one side of the housing, a plurality of connection elements is permanently connected to the housing, by means of which connection elements the sensors and actuators and the serial bus system can be connected to the motherboard. There are various connection techniques for connecting the sensors and actuators and the serial bus system to the housing, the connection elements being embodied, for example, as cable bushing connectors, plug-type connectors or plug-type/screw-type connectors. However, because the respective connection elements are permanently connected to the housing, such field-bus connecting devices have the disadvantage that the respective connection technique is fixed for each housing, and that in the event of defects in one or more connection elements the entire field-bus connecting device has to be replaced.

German Offenlegungsschrift DE 44 37 316 A1 discloses a field-bus connecting device in which a plurality of connection elements can be connected to a motherboard which is embodied as a signal processing device and which is arranged in a square housing. In each case a plurality of connection elements are arranged in a module here, the modules having plug-type connectors for plugging onto mating plug-type connectors which are provided on the motherboard, that is to say they can be replaced individually.

In such a field-bus connecting device, the modules can indeed each be replaced individually, but the motherboard with the associated electronics is then freely accessible from the outside, entailing the risk of the electronics being damaged or tampered with by the user. Furthermore, the configuration of the modules is largely prescribed for each module location on the motherboard, with the result that different connection techniques cannot be combined as desired.

German Offenlegungsschrift DE 39 33 099 A1 discloses a modular assembly and wiring system in which a plurality of housings with inserted modules which are locked by means of securing latches are plugged onto an insulated busboard. Owing to the fact that the modules are closed, it is not possible to replace different connection elements as desired. In addition, the busboard is also freely accessible in this device when the modules are being replaced.

German patent DE 197 16 137 C1 and German utility model DE 296 07 525 U 1 each disclose connecting devices for connecting actuators and/or sensors which have one or more upper parts which can be fitted onto a lower part and have a plurality of connection elements for the sensors and actuators. In addition, German Offenlegungsschrift DE 196 15 093 A1 discloses a serial interface for field buses which has an automation unit with a communications adapter which can be plugged onto a plug-type connector. There is no provision for different connection techniques to be implemented by replacing individual connections in these devices, nor is this possible.

Finally, German patent DE 44 12 270 C2 discloses a decentralized interface module for a bus system in which the electronic control unit can be assembled with differently equipped connection fittings in order to adapt it to different connection techniques. However, the control electronics are inevitably freely accessible here and thus exposed to the risk of damage or tampering.

SUMMARY OF THE INVENTION

It is an object of the present invention to provide a field-bus connecting device in which different connection techniques can be combined or replaced as desired. It is a further object of the invention to provide a field-bus connecting device in which electronics contained therein are protected against damage and tampering in the event of such a replacement.

In accordance with the present invention, the modules, in a field-bus connecting device with a motherboard which is arranged in an essentially rectilinear housing at the base and a plurality of modules, which hold at least one connection element by means of a module mounting board, for connection to the motherboard, the housing having at the connection element end a plurality of receptacles for, in each case, one module and each module being detachably coupled to the motherboard by means of a connector arrangement which is plugged onto the motherboard, each module comprise a module board which is connected to the respective module mounting board, is configured to correspond to the at least one connection element and couples the module to the motherboard by means of the connector arrangement, and the receptacles each have a receptacle space, open at the connection element end, for, in each case, one module with base-end openings for the connector arrangement.

Because the modules are not directly coupled to the motherboard, but rather by means of module boards which are configured to correspond to the respective connection elements, different connection techniques, for example cable bushing connectors, can be implemented easily and combined as desired, because it is necessary only to replace the respective module board with the connection element. At the same time, in the event of such a replacement, the motherboard with the associated electronics is not exposed to access by the user owing to the receptacle spaces which are especially provided for each module. This also enables the modules to be sealed individually with respect to the housing, thus permitting a higher protection class.

Preferably, the module mounting boards are detachably secured in the receptacles by means of clamping elements, it being possible to release or secure the module mounting boards by, for example, a slight revolution of, for example, 90° of the respective clamping element.

In addition, the receptacles for the module mounting boards preferably have a peripheral supporting edge in a countersunk arrangement. Furthermore, a flat seal is preferably inserted between the supporting edge and the associated module mounting board.

Further advantages and embodiments of the invention are to be gathered from the following description and in the sub-claims.

The invention will be explained in more detail below with reference to exemplary embodiments which are illustrated in the appended figures.

DETAILED DESCRIPTION OF THE PREFERRED EMBODIMENT

Figure 1:
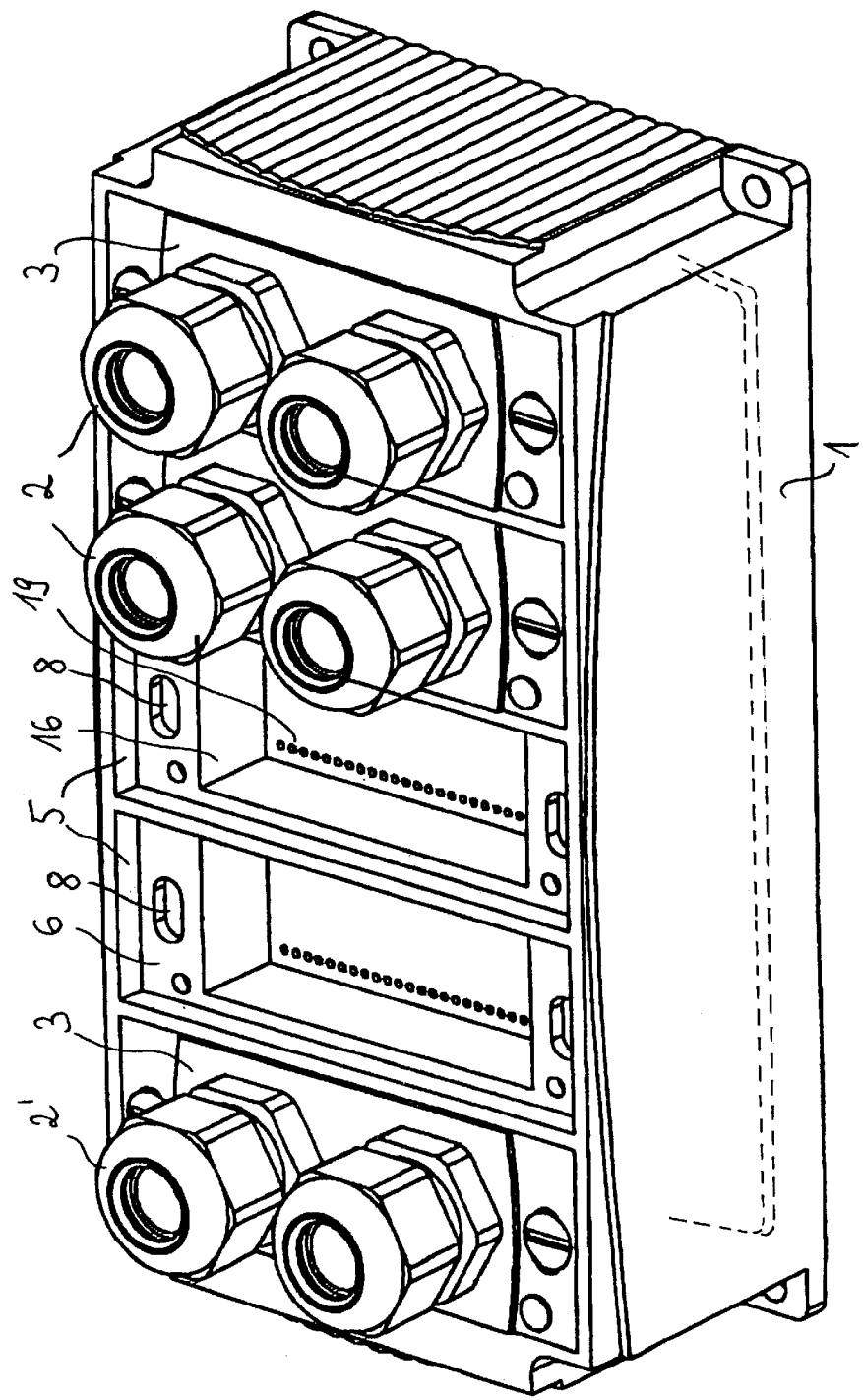
FIG. 1 shows a perspective view of a field-bus connecting device according to the invention.

According to FIG. 1, a field-bus connecting device according to the present invention comprises an essentially rectilinear housing 1. On one side of the housing 1, a plurality of essentially cylindrical connection elements 2, 2', which are embodied here as cable bushing connectors, are arranged, preferably in pairs. Here, a pair of connection elements 2' (see FIG. 3) is provided, in particular for connecting to a serial bus of a serial bus system, while the other two pairs (see FIG. 2) of connection elements 2 are provided for connecting to sensors and actuators.

In the housing 1, a motherboard (indicated in phantom) is held and supported on the base side facing away from the connection element 2, 2'. A cable (not illustrated), which is electrically connected to the motherboard in the housing 1, can be led through each of the connection elements 2, 2'.

Figure 2:
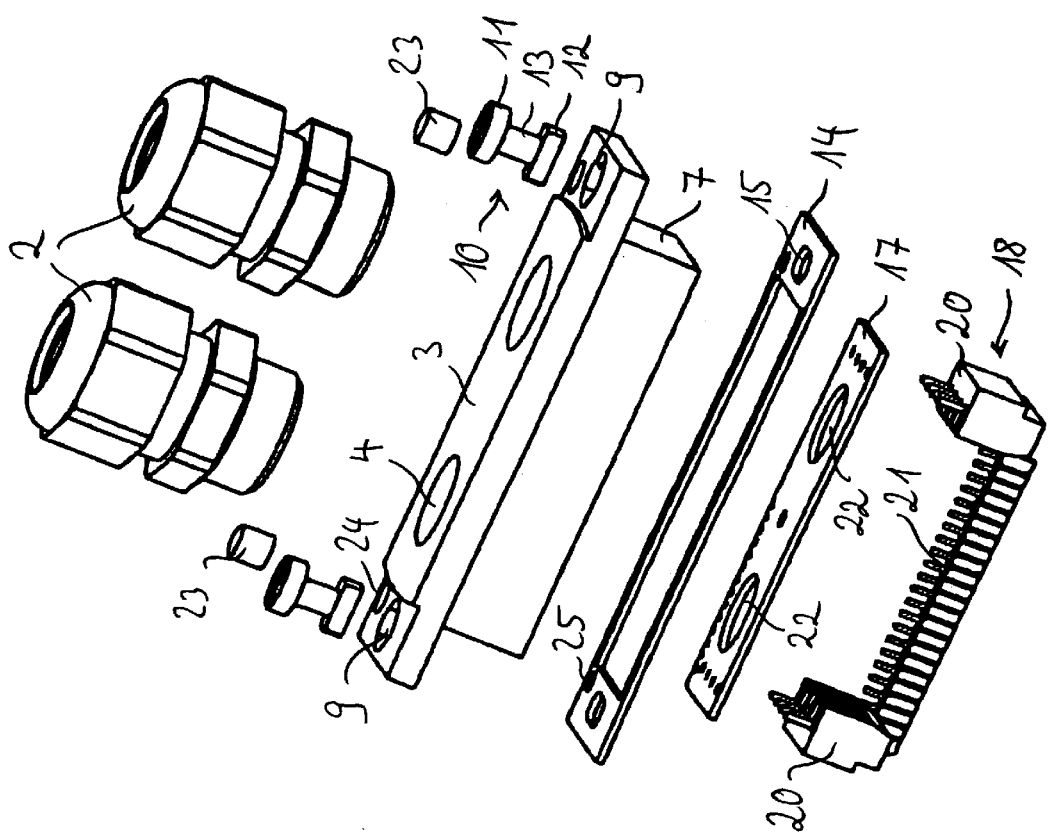
FIGS. 2 and 3 each show part of the field-bus connecting device from FIG. 1 in an exploded view.
Figure 3:
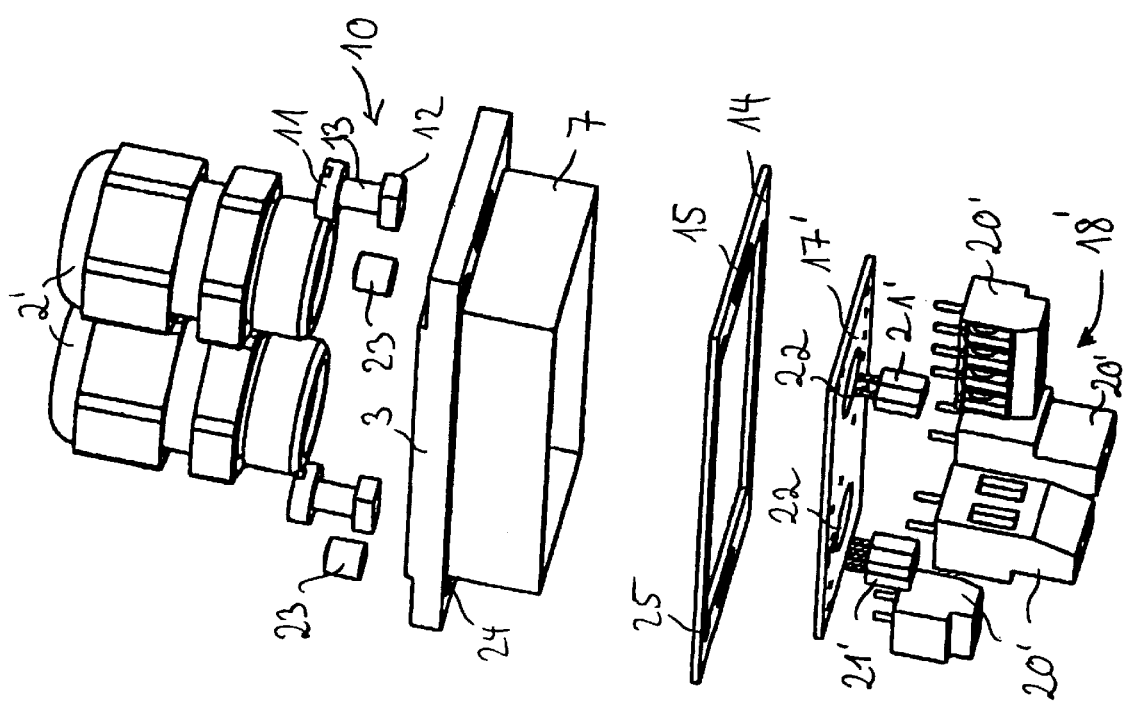

According to FIGS. 2 and 3, each pair of connection elements 2, 2' is secured to a module mounting board 3 which is rectangular in plan view. Preferably, each connection element 2, 2' is screwed into a threaded hole 4 (threading not illustrated) provided in each case in the module mounting board 3, but the connection elements can also be cast with the respective module mounting board 3. The module mounting boards 3 are identical and are inserted into identical receptacles 5 which are provided for this purpose on the housing 1 at the connection element end, two receptacles 5 being unoccupied in FIG. 1 for the sake of greater clarity. Preferably, the receptacles 5 each have a supporting edge 6, in a countersunk arrangement, for the module mounting boards 3, in each case one module mounting board 3 extending with a projection 7 into the receptacle space of the respective receptacle 5.

Preferably, the individual module mounting boards 3 are each clamped against the housing 1. According to the embodiment illustrated in FIGS. 1 to 3, receptacles 5, have, for this purpose, two elongated holes 8 each, provided in the supporting edge 6, and the module mounting boards 3 have two elongated holes 9 which each correspond to the latter. In addition, clamping elements 10 are provided, each clamping element 10 having a head 11 and a stop element 12, which are connected by means of a shaft 13. In each case one of the clamping elements 10 is plugged through the corresponding elongated holes 8, 9 of a receptacle 5 and of an inserted module mounting board 3 and is rotated with respect to the receptacle 5 or the module mounting board 3. The receptacles 5 each have on the underside adjacent to the elongated holes 8 a cam face (not shown), the stop element 12 being pressed against the cam face when a clamping element 12 rotates in relation to the respective receptacle 5, and the respective module mounting board 3 is thus clamped to the corresponding receptacle 5. In this way, the module mounting boards 3 are each detachably secured to the housing 1 in a receptacle 5 by means of a bayonet closure which is formed in this way. Alternatively, the module mounting boards 3 can also each be secured in the corresponding receptacles 5 by means of clip closures.

Preferably, according to FIGS. 2 and 3, in each case a flat seal 14 is inserted between the supporting edge 6 and the associated module mounting board 3, with the result that each module mounting board 3 is individually sealed with respect to the housing 1 in each case. Each flat seal 14 also has two elongated holes 15 which are flush with the elongated holes 8, 9 of the respective receptacle 5 and the respective module mounting board 3.

The receptacles 5 preferably each have an insert 16 in order to form, in each case, one receptacle space defined in part by a floor and open in the insertion direction within the corresponding receptacle 5. As a result, in each case one module mounting board 3 can be inserted into each insert 16 without the motherboard with the associated electronics being freely accessible from outside.

In each case a module board 17, 17' which is configured to correspond to the connection elements 2, 2' which are secured to it is provided for each module mounting board 3. The module board 17 is fastened in that the nut of connection element 2 is screwed off, the threaded neck (or leading end) of connection element 2 is passed through openings 4 and 22 and then the nut is fastened again. The module board 17 is then within part 7, whereas seal 14 surrounds part 7 at its outside. Each module board 17, 17' is detachably coupled to the motherboard by means of a multipoint connector strip 18, 18' which is plugged onto the motherboard and soldered to the module board 17, 17'. For this purpose, plug pins or plug sockets (not illustrated) are arranged on the motherboard, and holes 19 which correspond to said pins and sockets are arranged in the floor of the respective insert 16, so that the plug pins and plug sockets project out of the holes 19 and the respective multipoint connector strip or arrangement 18, 18' can be plugged onto them.

According to FIGS. 2 and 3 the multipoint connector strip 18, 18' is of different design depending on whether it is provided for connection to sensors/actuators or for connection to a serial bus. Owing to the perspective view, the size relationships in FIGS. 2 and 3 are slightly changed. For the sake of clarification, in each case a pair of connection elements 2, 2' with the associated module mounting board 3 and module board 17,17' are illustrated in an exploded view, the arrangement which is illustrated in FIG. 2 being provided for connection to sensors/actuators and the arrangement which is illustrated in FIG. 3 being provided for connection to a serial bus.

The connector strip arrangements 18, 18' which are illustrated in FIGS. 2 and 3 comprise terminal strips 20, 20' which are each soldered to the respective module board 17, 17' and in which a cable which is led through one of the threaded holes 4 is clamped in a sealing fashion (not illustrated). Conductor tracks (not illustrated), which electrically couple the terminal strips 20, 20' to the other multipoint connectors 21, 21' of the multipoint connector strip arrangement 18, 18' which are plugged onto the plug pins or plug sockets of the motherboard, are provided on each module board 17, 17'. In the case of the connector arrangement 18 from FIG. 2, it is possible, in addition to the connection of the lines of the sensors and actuators, also to feed in a supply voltage for the actuators via the terminal strips 20. In the case of the connector arrangement 18' from FIG. 3, apart from the lines for connecting a serial bus, a supply voltage for the motherboard and, if appropriate, in addition the supply voltage for the actuators are connected to the terminal strip 20'.

The module boards 17, 17' have, for each of the connection elements 2, 2', plug-through openings 22 which are flush with the threaded holes 4 (or with the simple holes without threading) in the respective module mounting board 3. A cable which is fed through one of the threaded holes 4 is also led through the respective plug-through opening 22, and extends with one end through the respective connection element 2, 2' and is clamped by the other end in the respective terminal strip 20, 20'.

When a plug-type connector or plug-type/screw-type connector is used as the connection element 2, 2', a cable which is electrically connected to the respective plug-type connector can also be led through the plug-through openings 22, said cable electrically connecting said plug-type connector to the corresponding terminal strip 20, 20'. However, alternatively, the plug-type connector can also be of two-part design, a lower part being coupled to the associated module board 17, 17' by means of the plug-type connection, and an upper part which is detachably connected to the lower part serving as plug element.

According to FIGS. 4a to 4f, connection elements 2, 2' of different sizes (FIGS. 4a to 4c) and other connection elements 2, 2' such as plug-type connectors (FIG. 4d), insulating piercing connecting devices (FIG. 4e), plug-type/screw-type connectors or even a combination of such connection elements can also be used. In addition, instead of a module mounting board 3, a blanking plate (FIG. 4f), for example for additional electronics or relays, can also be used.

Preferably, in each case one LED display which indicates the switched state of a sensor/actuator connection is electrically connected to the motherboard for each module mounting board 3. Each of the module mounting boards 3 has, in each case, a transparent insert 23 which is arranged adjacent to the respective LED display, in holes 24, 25 provided especially for this purpose in each case, in the respective module mounting board 3 or the flat seal 14, said insert 23 being sealed with respect to the module mounting board 3 when the module mounting board 3 is clamped against the housing 1. LED displays may optionally also be accommodated directly in the housing 1.

Figure 4:
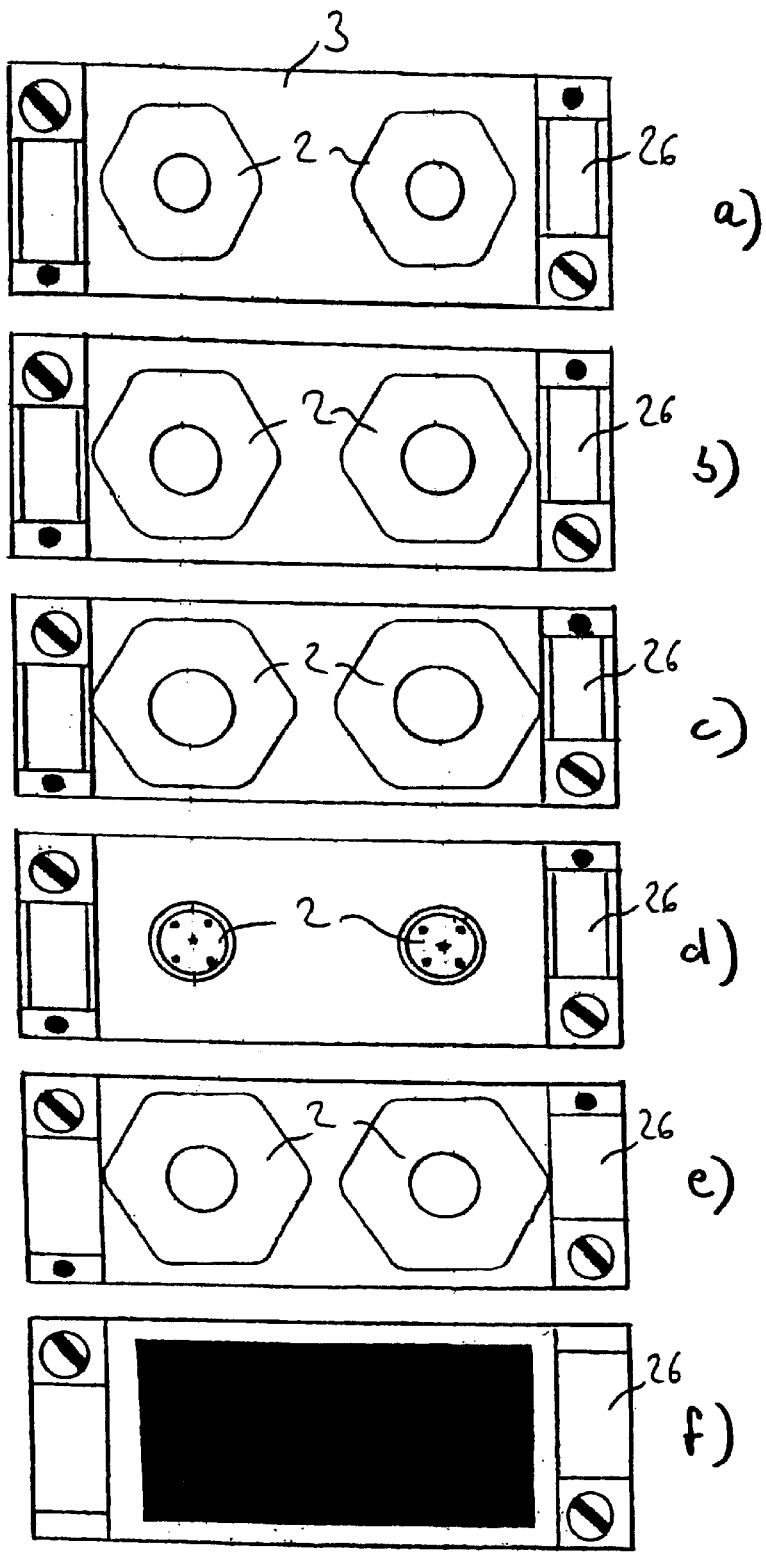
FIGS. 4a to 4f show, in plan view, module mounting boards of the field-bus connecting device from FIG. 1 with different connection elements.

According to FIGS. 4a to 4c, the module mounting boards 3 may also each comprise a module location 26 for a label plate.

The module mounting boards 3 or the housing 1 are mechanically or electrically encoded to prevent them being rotated or interchanged.

While the invention has been shown as described with reference to a preferred embodiment, it should be apparent to one of ordinary skill in the art that many changes and modifications may be made without departing from the spirit and scope of the invention as defined in the claims.

What is claimed is:

1. A field-bus connecting device comprising:
a substantially rectilinear housing having a base;
a motherboard arranged adjacent to said base;
a plurality of modules each holding at least one connection element by means of a module mounting board for insertion along an insertion direction into the housing for connection to the motherboard;
wherein
said housing is provided with a plurality of receptacles for respectively receiving one module along said insertion direction;
each module is detachably coupled to said motherboard by means of a multi point connector arrangement which is plugged onto the motherboard;
each module comprises a module board which is connected to a respective module mounting board and configured to correspond to the at least one connection element;
each module is coupled to said motherboard by means of said connector arrangement; and
said receptacles each have a receptacle space defined in part by a floor and open in the insertion direction, and openings in the floor for the connector arrangement to couple with the motherboard.

2. The field-bus connecting device of claim 1, wherein the module mounting boards are secured in the receptacles by means of clip closures.

3. The field-bus connecting device of claim 1, wherein at least some of the connection elements have a lower part which is coupled to the associated module board by means of a plug-type connection, and an upper part which is detachably connected to said lower part and serves as a plug element.

4. The field-bus connecting device of claim 1, wherein that the connection elements comprise cable bushing connections, plug-type connectors, plug-type/screw-type connectors and/or insulation piercing connecting devices.

5. The field-bus connecting device of claim 1, wherein the module mounting boards each comprise a mounting location for a label plate.

6. The field-bus connecting device of claim 1, wherein the module mounting boards or the housing are mechanically or electrically encoded to prevent them being rotated round or interchanged.

7. The field-bus connecting device of claim 1, wherein the module mounting boards are detachably secured in the receptacles by means of clamping elements.

8. The field-bus connecting device of claim 7, wherein the receptacles and the module mounting boards have corresponding elongated holes for, in each case, one clamping element.

9. The field-bus connecting device of claim 8, wherein a stop for the respective clamping element is provided on the bottom of each of the receptacles.

10. The field-bus connecting device of claim 1, wherein the multipoint connector arrangement comprises terminal strips.

11. The field-bus connecting device of claim 10, wherein the module mounting boards and the module boards have, for at least some of the connection elements, flush plug-through openings through which a cable which electrically connects the respective connection element to a corresponding terminal strip is led.

12. The field-bus connecting device of claim 11, wherein the plug-through openings of the module mounting boards are threaded holes into which in each case one connection element can be screwed.

13. The field-bus connecting device of claim 1, wherein the receptacles each have a peripheral supporting edge, in a countersunk arrangement, for the module mounting boards.

14. The field-bus connecting device of claim 13, wherein a flat seal is inserted in each case between the supporting edge and the associated module mounting board.

15. The field-bus connecting device according to claim 13, wherein at least some of the module mounting boards have a projection which is configured to correspond to the respective supporting edge.

16. The field-bus connecting device of claim 1, wherein the connection elements are configured to connect a serial bus system and a plurality of sensors and actuators.

17. The field-bus connecting device of claim 16, wherein the module mounting boards each comprise a LED display for the switched state of a sensor/actuator connection.

* * * * *